(12) United States Patent
Matsuyama et al.

(10) Patent No.: US 6,514,570 B1
(45) Date of Patent: Feb. 4, 2003

(54) SOLUTION PROCESSING APPARATUS AND METHOD

(75) Inventors: Yuji Matsuyama, Kikuchi-gun (JP); Shuichi Nagamine, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 14 days.

(21) Appl. No.: 09/678,705

(22) Filed: Oct. 3, 2000

(30) Foreign Application Priority Data

Oct. 5, 1999 (JP) ............................................. 11-283766

(51) Int. Cl.[7] .............................. B05D 1/02; B05D 3/12; B05B 3/00
(52) U.S. Cl. ....................... 427/421; 427/425; 427/240; 118/300; 118/320; 118/323
(58) Field of Search ................................ 427/425, 346, 427/356, 357, 421, 422, 424, 426, 427, 240, 241; 118/52, 56, 107, 300, 326, 323, 301, 320; 396/611

(56) References Cited

U.S. PATENT DOCUMENTS 5,625,433 A * 4/1997 Inada et al. .................. 396/604
5,689,749 A   11/1997 Tanaka et al. ............... 396/611
5,893,004 A * 4/1999 Yamamura .................. 396/611
5,945,161 A * 8/1999 Hasimoto et al. ........... 427/240
5,965,200 A   10/1999 Tateyama et al. ........... 427/240

* cited by examiner

*Primary Examiner*—Shrive P. Beck
*Assistant Examiner*—Eric B Fuller
(74) *Attorney, Agent, or Firm*—Oblon, Spivak, McClelland, Maier & Neustadt, P.C.

(57) ABSTRACT

A solution separation ring made of a material with adhesion to a processing solution stronger than that of a rear face of a wafer is provided to surround the periphery of a substrate horizontally held by a spin chuck with a slight clearance therebetween. A supply nozzle is moved from one end side to the other end side of the substrate while supplying the processing solution, and discharge ports of the supply nozzle are allowed to get closer to a summit portion of the solution separation ring near the other end side of the substrate. At this time, the processing solutions on the discharge ports and the front face of the substrate which are contiguous with each other by surface tension are separated caused so as to flow toward the solution separation ring side, thereby preventing an excessive processing solution from returning onto the front face of the substrate.

20 Claims, 10 Drawing Sheets

SOLUTION PROCESSING APPARATUS AND METHOD

CROSS-REFERENCE TO RELATED APPLICATIONS

This application is based upon and claims the benefit of priority from the prior Japanese Patent Application No. 11-283766, filed Oct. 5, 1999, the entire contents of which are incorporated herein by reference.

BACKGROUND OF THE INVENTION

The present invention relates to a solution processing apparatus and method for supplying a developing solution to a front face of, for example, a substrate coated with a resist and subjected to exposure processing, thereby to perform developing processing.

A mask for forming a circuit pattern on a front face of a semiconductor wafer (hereinafter, referred to as a wafer) or an LCD substrate of a liquid crystal display is formed as follows. Initially, a photoresist solution (hereinafter, referred to as a resist) is coated on a front face of a wafer and irradiated by light or the like. If the resist is a negative type by way of example, a portion thereof applied with light is cured, and a portion not cured, an easy-to-dissolve portion, is dissolved with a developing solution, whereby an object mask is formed. A developing processing apparatus comprises a spin chuck for vacuum-holding and rotating a wafer and a developing solution supply nozzle for supplying a developing solution to the wafer on the spin chuck.

Conventionally, a supply nozzle in which many discharge ports are arranged over an area corresponding to a wafer W in a diameter direction is used as the developing solution supply nozzle used in a developing step as described above.

The discharge of the developing solution by the supply nozzle will be explained. The supply nozzle is positioned so that the discharge ports are, for example, 1 mm above the front face of the wafer W at the middle portion of the wafer W, and the wafer W is rotated 180 degrees while the developing solution is supplied from the discharge ports to the middle portion in the diameter direction of the front face of the wafer W. Thereby, the developing solution is spread over the entire wafer W while being discharged from the middle portion in the diameter direction of the wafer W, in a result that solution heaping is completed. Simultaneously, a developing solution film with a predetermined thickness is formed on the entire front face of the wafer W.

Conventionally, in the step of heaping the developing solution over all of a top face of the wafer, it is required for obtaining uniformity of line width to close to the same as much as possible. To this end, the developing solution needs to be rapidly applied to the wafer, and thus a supply pressure of the developing solution is kept high.

However, in the conventional developing processing method, the developing solution supply nozzle is formed so that the discharge ports thereof are small in diameter and the supply pressure thereof is set high for the sake of uniform discharge, resulting in high discharge flow velocity. Therefore, an impact on a dissolved portion of the front face of the wafer is high at the time of initial discharge to the front face of the wafer, whereby the uniformity in line width is susceptible to decreasing.

Further, there exists a portion where the first discharged developing solution and the last discharged developing solution are overlapped within an area close to the middle of the wafer under the supply nozzle, whereby old and new developing solutions are mixed and thus developing proceeds in the portion more than in other portions, thereby also bringing about a danger that uniformity in line width of the area close to the middle deteriorates.

Additionally, since the developing solution is discharged while the wafer is rotated, solution face waviness occurs at the time of heaping of the developing solution caused by inertial force of the developing solution and there occur an area where the developing solutions are vigorously mixed and an area without such vigorous mixture, thereby bringing about a disadvantage that the uniformity of the developing becomes worse.

There is a scan-type coating means using the same developing solution supply nozzle as the aforementioned, in which the supply nozzle is placed at the outside of the rim of the wafer W and moved therefrom to the outside of the rim of the wafer on the other side while performing discharge.

For example, in such a scan-type coating means, when the supply nozzle 12 passes through an area above the wafer W and leaves a position above the end portion of the wafer W, the developing solution near the discharge ports 11 of the supply nozzle 12 is caused to be in a state as shown in FIG. 10A, wherein the developing solution applied on the front face of the wafer W and the developing solution supplied from the discharge ports 11 are stretched (see portion P) while they are contiguous with each other by respective surface tensions.

However, when the discharge ports 11 leaves the developing solution due to the movement of the supply nozzle 12, a pull back phenomenon occurs in reaction thereto in which the developing solution at the portion P stretched by surface tension returns to the edge portion of the front face of the wafer W. This causes a problem that the developing solution is supplied more on the front face at the rim portion of the wafer W than on the front face of the other parts of the wafer W as shown in FIG. 10B, which brings about a disadvantage that line width becomes nonuniform.

BRIEF SUMMARY OF THE INVENTION

It is an object of the present invention to provide a solution processing apparatus and a method thereof capable of performing uniform solution processing on a front face of a substrate.

According to a first aspect of the present invention, there is provided a solution processing apparatus comprising: a substrate holding portion which horizontally holds a substrate; a supply nozzle which moves from one end side to the other end side of the substrate held by the substrate holding portion to perform supply of a processing solution to a front face of the substrate; and a solution separation ring provided to surround a periphery of the substrate with a slight clearance therebetween to separate the processing solution existing between the other end of the substrate and the supply nozzle by surface tension from the substrate and allow the developing solution to adhere to the solution separation ring when the supply nozzle leaves the other end side of the substrate outward, the solution separating ring being made of a material with adhesion to the processing solution stronger than that of the substrate.

With the above configuration, occurrence of a pull back phenomenon can be prevented when the supply nozzle leaves the other end side outward, so that uniform solution processing can be performed over the entire front face of the substrate.

According to the second aspect of the present invention, there is provided a solution processing method comprising the steps of; holding a substrate on a substrate holding portion; supplying a processing solution to a front face of the substrate while moving a supply nozzle from one end side to the other end side of the substrate held by the substrate holding portion; allowing the processing solution to exist among a solution separation ring provided to surround the substrate with a slight clearance therebetween, the other end of the substrate, and the supply nozzle by surface tension when the supply nozzle leaves the other end side of the substrate outward; and thereafter allowing the processing solution to leave the other end of the substrate and adhere to the solution separation ring when the supply nozzle moves further outward.

With the above configuration, occurrence of a pull back phenomenon can be prevented when the supply nozzle leaves the other end side outward, so that uniform solution processing can be performed over the entire front face of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
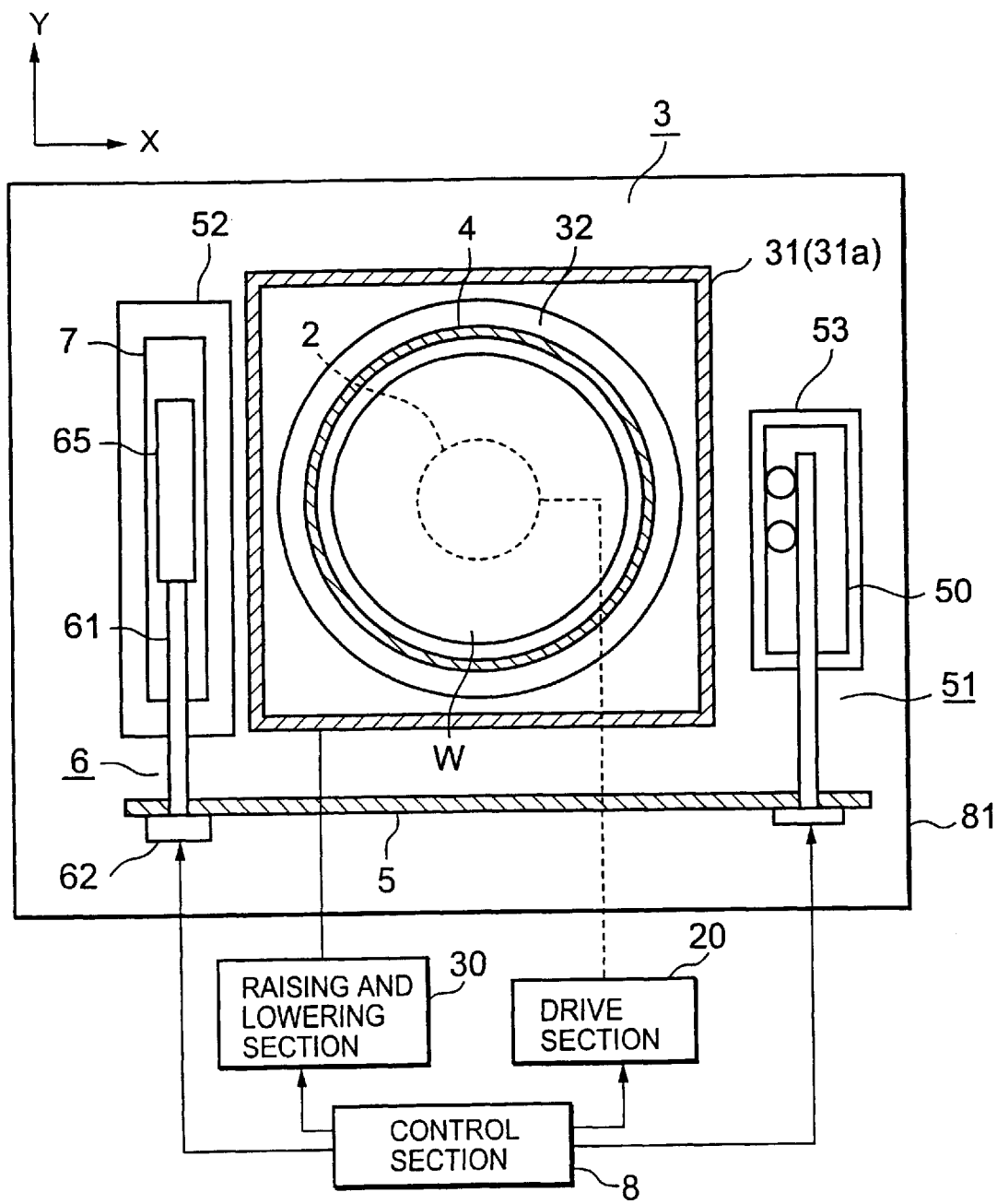
FIG. 1 is a plan view showing an embodiment of a solution processing apparatus according to the present invention.
Figure 2:
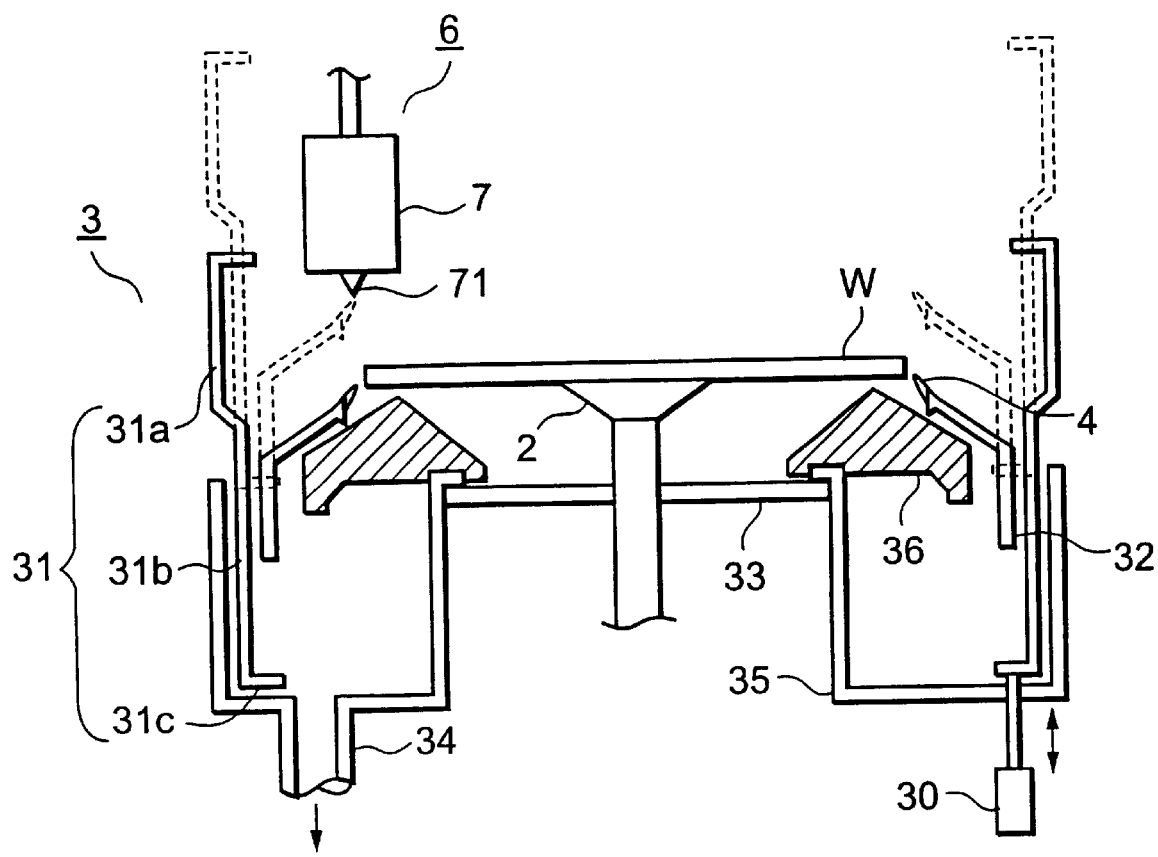
FIG. 2 is a sectional view showing the embodiment of the solution processing apparatus according to the present invention.

FIGS. 1 and 2 are schematic diagrams showing an embodiment employing a solution processing apparatus, according to the present invention, in a developing apparatus. Numeral 2 denotes a spin chuck forming a substrate holding portion for vacuum-holding a central potion of the rear face of a wafer W as a substrate and horizontally holding it. This spin chuck is rotated, ascended, and descended by a drive section 20.

A cup 3 is provided to surround the side of the war W in a state in which the wafer W is vacuum-held by the spin chuck 2. The cup 3 is composed of an outer cup 31 and an inner cup 32 which are ascendable and descendable individually. The inner cup 32 is formed so that the cylindrical top portion side thereof inclines inwardly toward the top and an upper side opening portion is smaller in diameter than a lower side opening portion. When the outer cup 31 is raised by a raising and lowering section 30, the inner cup 32 ascends and descends together with the outer cup 31 within part of a moving range of the outer cup 31.

Figure 5A:
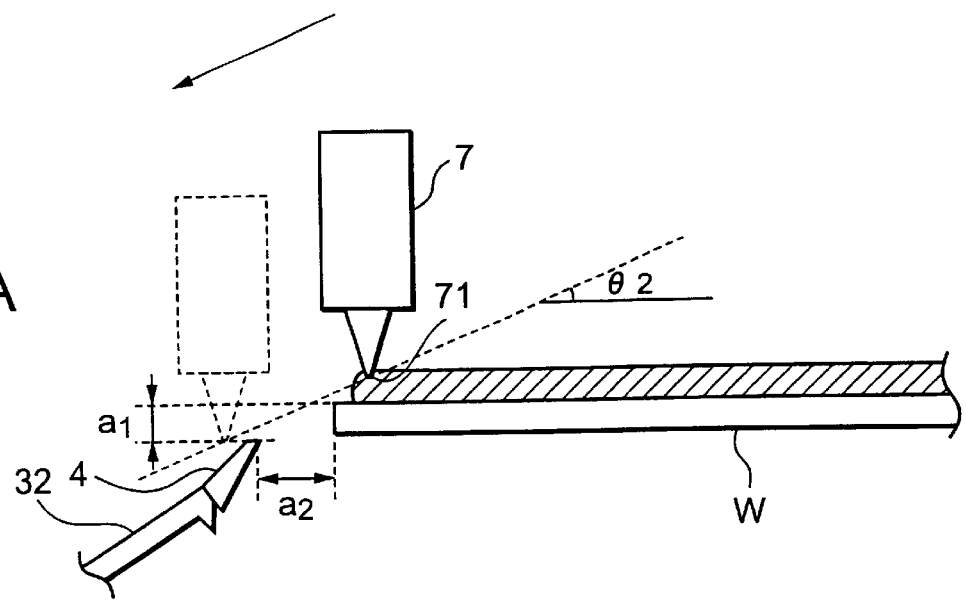
FIGS. 5A and 5B are explanatory views explaining operations of the solution processing apparatus.

At the top end of the inner cup 32 is provided a knife ring 4 which is formed to incline inwardly toward the top and taper down at the tip (the top end). The knife ring 4 is for preventing a processing solution supplied from a supply nozzle (to be described in more detail below) to the front face of the wafer W from coming onto the rear face of the wafer W at the edge portion of the wafer W. The knife ring 4 also guides the processing solution to run along the inner cup 32 and to drip downwardly. To this end, the top end portion of the knife ring 4 is positioned to surround the outer periphery of the wafer W with a slight clearance therebetween while the inner cup 32 is at a lowered position. For the aforesaid reason, a material of the knife ring 4 needs the conditions satisfying adhesion to a processing solution, for example, a developing solution stronger that of the rear face of the wafer W, and having certain chemical resistance and ability to be made into a ring. As for the knife ring 4, alumina ($Al_2O_3$) is used as the material thereof, and the position thereof is set such that, for example, a distance a1 between the top end portion thereof and the front face of the wafer W is 1 mm, and a distance a2 between the inner side tip thereof and the outer periphery of the wafer W is 3 mm as shown in FIG. 5A while the inner cup 32 is at a lowered position.

The lower portion of the cup 3 is composed of a disc 33 surrounding the periphery of the spin chuck 2 and a solution catch portion 35 provided with a recessed portion formed around the entire periphery of the disc 33 and a drain outlet 34 formed at a bottom face of the solution catch portion 35. The outer cup 31 (and the inner cup 32) is housed at the slightly inner side of the side face of the solution catch portion 35 and the aforesaid recessed portion and the cup 3 surround the side of the wafer W from the upper side level to the lower side level. A ring body 36 with a mountain-shaped cross section and the top end thereof being close to the rear face of the wafer W is further provided at the rim portion of the disc 33.

Next, the outside of the cup 3 will be explained. As shown in FIG. 1, for example, a guide rail 5 extending in an X-direction to be parallel to a side of an upper portion side cup 31a is provided outside of the outer cup 31, whereas a middle portion side cup 31b and an end portion side cup 31c are provided inside of the outer cup 31 as is shown in FIG. 2. In the state shown in FIG. 1, a first moving mechanism 6 for moving a supply nozzle and a second moving mechanism 51 for moving a rinse nozzle 50 are positioned at one end and the other end of the guide rail 5 respectively. The moving mechanisms 6 and 51 are guided by the guide rail 5 to be movable above the wafer W. The positions where the first moving mechanism 6 and the second moving mechanism 51 are shown in FIG. 1 are waiting portions 52 and 53, respectively, of the fist moving mechanism 6 and the second moving mechanism 51 during non-operation and each is composed of, for example, an ascendable and descendable plate-shaped body.

Figure 3:
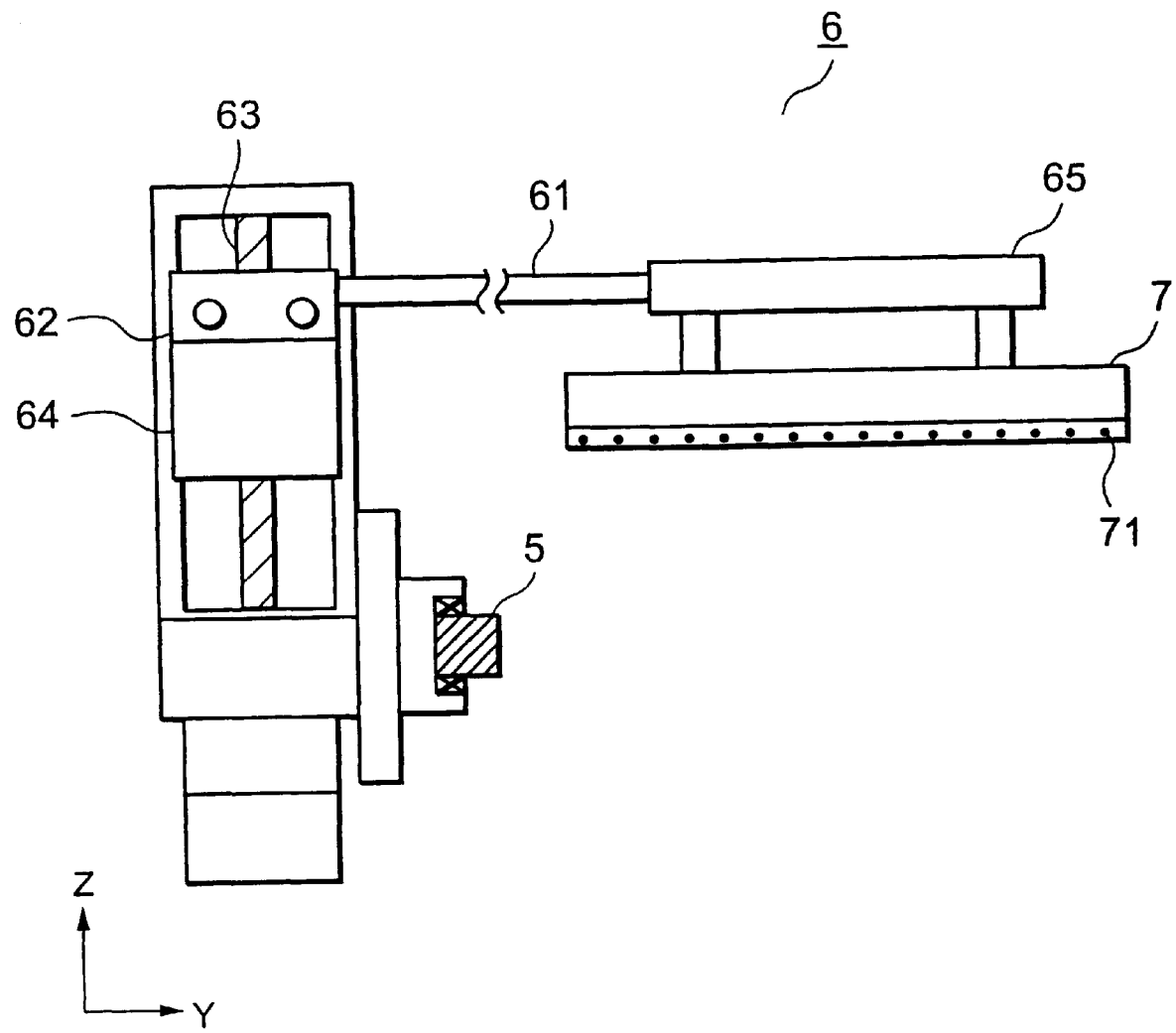
FIG. 3 is a side view showing a supply portion of the solution processing apparatus.

Explaining the first moving mechanism 6 with FIG. 3, an arm portion 61 for hanging and supporting a supply nozzle 7 including many processing solution discharge ports 71 arranged in a Y-direction is movable along the guide rail 5 through a base portion 62 that is a moving portion. As for the supply nozzle 7, it is required that the discharge ports 71 are arranged over the same dimension of a width of an effective area of the wafer W (a device-formation area) or more. In this embodiment, the discharge ports 71 are arranged slightly wider than the diameter of the wafer W to cover an area near a portion above the inner tip portion of the aforesaid knife ring 4. The base portion 62 includes a raising and lowering mechanism 64 composed of, for example, a ball screw mechanism 63 and can move the arm portion 61 in a Z-direction (the vertical direction) by driving force from a power source not shown such as a motor by way of example. The aforesaid supply nozzle 7 is hung and supported by a rotation shaft portion 65 on the tip side of the arm portion 61. The rotation shaft portion 65 is configured to be rotated to the right and left by a driving mechanism not shown, thereby inclining a direction in which the processing solution is discharged from the supply nozzle 7 back and forth in the X-direction relative to a downward vertical direction.

The drive section 20, the raising and lowering section 30, the first mechanism 6 and the second mechanism 51 which have been described hereinbefore are individually connected to a control section 8, thereby enabling ganged control of the respective portions, for example, performance of supply (scan) of the processing solution by the first moving mechanism 6 in response to ascent and descent of the spin chuck 2 by the drive section 20. The cup 3, the first moving mechanism 6, and the second moving mechanism 51 are formed as one unit which is enclosed by a casing 81 in a box shape and the wafer W is delivered by a transfer arm not shown. This will be explained later.

Next, operations in this embodiment will be explained. First, the spin chuck 2 is raised to a position above the cup 3 and the wafer W which has been already coated with a resist and subjected to exposure processing in the previous steps is delivered from the transfer arm not shown to the spin chuck 2. The spin chuck 2 is lowered so that the wafer W is placed at a predetermined position shown in FIG. 2. Incidentally, the outer cup 31 and the inner cup 32 are both in a state of being lowered at this time.

Figure 4A:
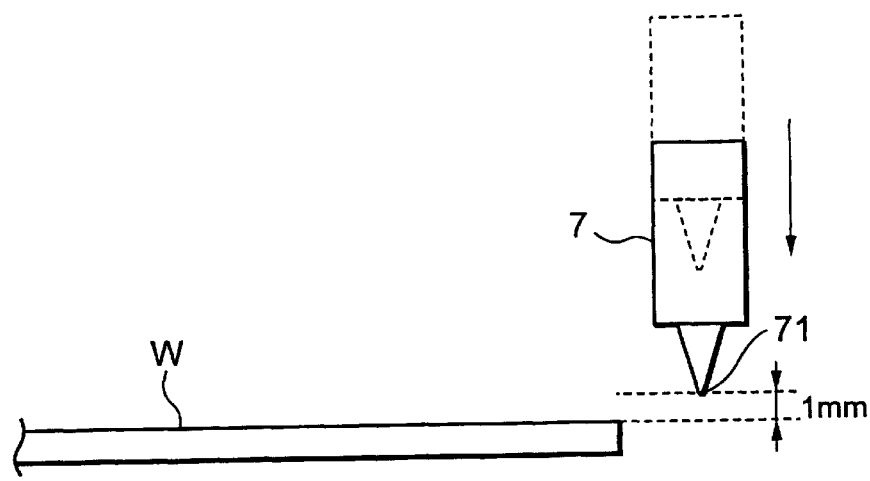
FIGS. 4A to 4C are explanatory views explaining operations of the solution processing apparatus.

Subsequently, the first moving mechanism 6 is guided along the guide rail 5 from an outside reference position of the outer cup 31 to a position corresponding to a portion between the upper portion side cup 31a and the rim of the wafer W and subsequently descends therefrom to a waiting position outside the rim of the wafer W. At this time, the position (height) of the supply nozzle 7 is set at the height where supply of a developing solution is performed for the wafer W. and thus the discharge ports 71 are placed at a position higher than that of the wafer W surface level by, for example, about 1 mm (FIG. 4A).

Figure 4B:
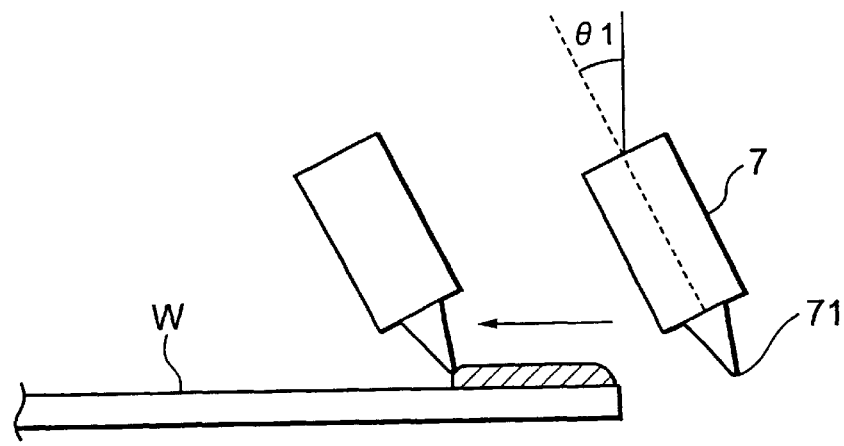

The rotation shaft portion 65 is rotated here by the not shown driving mechanism, and the supply nozzle 7 is inclined an angle $\theta 1$, for example, 10 degrees so that the discharge ports 71 face opposite in direction to the movement as shown in FIG. 4B, and then supply of the developing solution and scan of the supply nozzle 7 start. The supply nozzle 7 thus moves from one end side to the other end side of the wafer W (moves from right to left in FIG. 5A), whereby a solution film of a height of, for example, 1.2 mm is formed on the front face of the wafer W. At this time, the movement of the supply nozzle 7 is performed at a scan speed of, for example, about 250 mm/sec in such a manner that the center of the discharge area where the discharge ports 71 of the supply nozzle 7 are arranged passes through a position above the center of the wafer W.

Figure 4C:
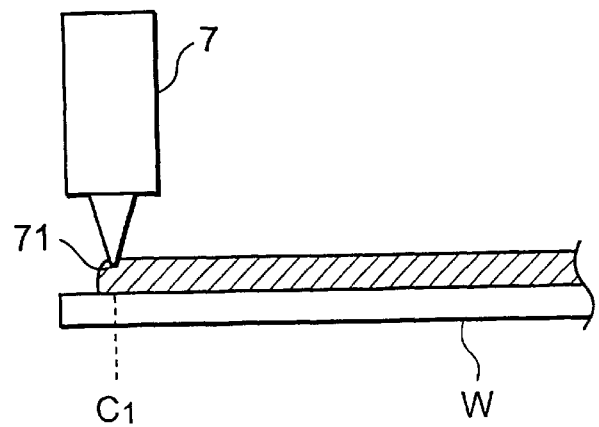

When the supply nozzle 7 gets closer to the edge portion of the wafer W, the control section 8 sends a signal for rotating the rotation shaft portion 65 the angle $\theta 1$ in the reverse direction to that at the start of scan to return the discharge direction of the supply ports 71 at a position C1 as shown in FIG. 4C to face vertically downward as in the state before the inclination in FIG. 4B. At the same time, the scan speed of the supply nozzle 7 is reduced to about 10 mm/sec.

Here, the arm portion 61 is lowered by the raising and lowering mechanism 64 while the supply nozzle is scanning, and control is performed such that the supply nozzle 7 moves in a direction shown by an arrow in FIG. 5A, for example, a direction of an angle $\theta 22$ slanting downward as seen from the horizontal direction. The angle $\theta 22$ is determined so that the discharge ports 71 and the tip of the knife ring 4 can pass each other without contacting while approaching each other to within, for example, about 1 mm due to the movement of the supply nozzle 7.

Figure 5B:
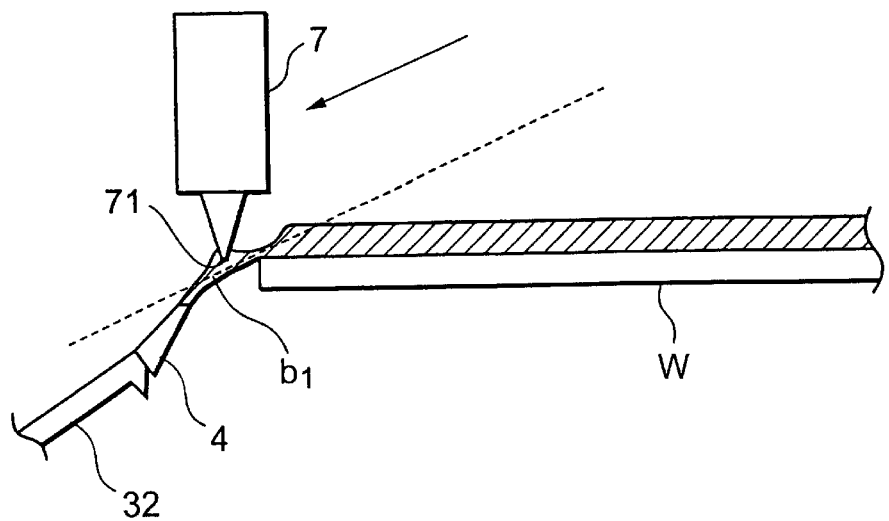

The supply of the developing solution is continued after the start of the lowering of the supply nozzle 7, and a developing solution to be supplied from the discharge ports 71 is contiguous with a developing solution which has been supplied onto the front face of the wafer W by surface tension of the developing solution as shown by b1 in FIG. 5B. As described above, since the knife ring 4 is made of a material with adhesion to the developing solution stronger than that of the rear face of the wafer W, when the developing solution discharged from the discharge ports 71 gets closer to the tip of the knife ring 4 by the approach of the knife ring 4 and the discharge ports 71, a portion of the developing solution connecting the discharge ports 71 and the front face of the wafer W is drawn to the knife ring 4 side. At this time, a summit portion of the knife ring 4 is at a position lower than that of the front face of the wafer W.

Figure 6A:
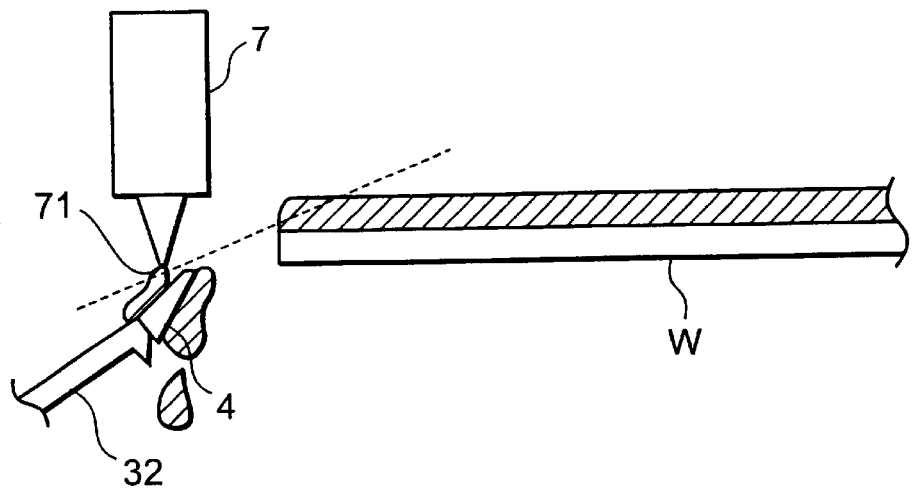
FIGS. 6A and 6B are explanatory views explaining operations of the solution processing apparatus.
Figure 6B:
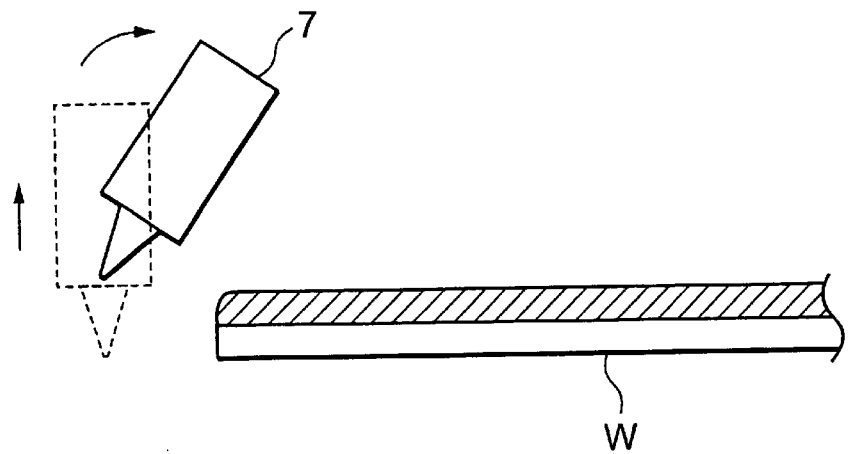

The discharge ports 71 and the tip of the knife ring 4 pass each other while being very close to each other as shown in FIG. 6A, which brings about a state in which the developing solution dripping from the discharge ports 71 is cut off by the knife ring 4. The developing solution having left the discharge ports 71 runs from the inside of the knife ring 4 and the remaining developing solution runs from the outside the knife ring 4 downward along the inner cup 32 respectively to be stored in the solution catch portion 35, and the respective developing solutions are drained from the drain outlet 34 through a drain line not shown.

In the state of FIG. 6A, as for the developing solution on the wafer W side having left the discharge ports 71, a small amount of it returns to the solution film on the wafer W, but almost excessive developing solution flows to the knife ring 4 side as described above, so that the above returning developing solution is not so great as to affect the developing result and never flows to the rear face side of the wafer W.

Then, the scan of the supply nozzle 7 and the supply of the developing solution are stopped above the inner cup 32. When a plurality of discharges of the developing solution to the wafer W are required here, the supply nozzle 7 is raised to the height where it is allowed to scan, for example, 1 mm above the front face of the wafer W as shown in FIG. 4A at the aforesaid stop position, inclined a predetermined number of degrees in the reverse direction to that of the prior time as show in FIG. 7, and then the supply of the developing solution is performed in such a manner to return the route which has been scanned to the prior time.

After the completion of the coating of the developing solution, rest developing of the wafer W is performed. The first moving mechanism 6 returns to the waiting portion 52 that is the reference position, and the second moving mechanism 51 replaces the first moving mechanism 6 and moves from the waiting portion 53 toward the wafer W. Then, a discharge portion of the rinse nozzle 50 is positioned above the center of the wafer W, and the spin chuck 2 is rotated and a rinse solution, for example, pure water is supplied to the central portion of the wafer W and spreads out from the central portion of the wafer W to the peripheral portion by centrifugal force to thereby rinse away the developing solution. Thereafter, the wafer W is subjected to steps such as a spin drying to complete developing processing.

As has been described, in the embodiment according to the present invention, the knife ring 4 surrounding the periphery of the wafer W held by the spin chuck 2 with a slight clearance therebetween is provided, and when the supply nozzle 7 for supplying the developing solution by scanning from one end side to the other end side of the wafer W leaves the end portion of the wafer W, the discharge ports 71 of the supply nozzle 7 and the tip of the knife ring 4 pass each other with a slight clearance therebetween and the developing solutions of the discharge ports 71 and on the front face of the wafer W which are contiguous with each other by surface tension are artificially separated, thereby preventing a previously occurred pullback phenomenon in which the developing solution having been separated from the discharge ports 71 returns onto the front face of the wafer W by the surface tension thereof.

As the material of the knife ring 4, a material having surface tension stronger than that of the rear face of the wafer W, for example, alumina is used, whereby an excessive developing solution which is unnecessary to be supplied onto the wafer W can be drawn to the knife ring 4 side and thus occurrence of a pull back phenomenon can be further prevented. Consequently, the amount of the developing solution toward the wafer W side out of the developing solution separated from the discharge ports 71 is decreased. Therefore, even if the developing solution adheres to the outer periphery of the wafer W, an amount of the developing solution coming to the rear face side of the wafer W is decreased, whereby the film thickness on the front face of the rim portion of the wafer W becomes stable, resulting in a uniform line width of a pattern.

Further, the height of the tip portion of the knife ring 4 is set to be slightly lower than that of the front face of the wafer W, and the supply nozzle 7 slides slantingly downward from the direction of the movement so that the discharge ports 71 thereof pass by the tip portion of the knife ring 4 to separate the developing solution, whereby an excessive developing solution which previously pulls back to the front face of the wafer W can be guided to the knife ring 4 side. If the tip portion of the knife ring 4 is placed at the same height as that of the front face of the wafer W, a solution on the front face of the wafer W flows toward the tip portion at the separation of the solution. Hence, the tip portion of the knife ring 4 is positioned to be slightly lower in height than the front face of the wafer W, thereby preventing the above situation.

Furthermore, the knife ring 4 is provided at the top end portion of the inner cup 32 and surrounds the entire periphery of the wafer W held by the spin chuck 2. Therefore, even if an excessive developing solution is supplied from the discharge ports 71 at the right and left ends to an area outside the wafer W, the developing solution can be guided to the inner cup 32 side by surface tension of the knife ring 4, thereby reducing the amount of the developing solution supplied to the rim of the wafer W.

Figure 7:
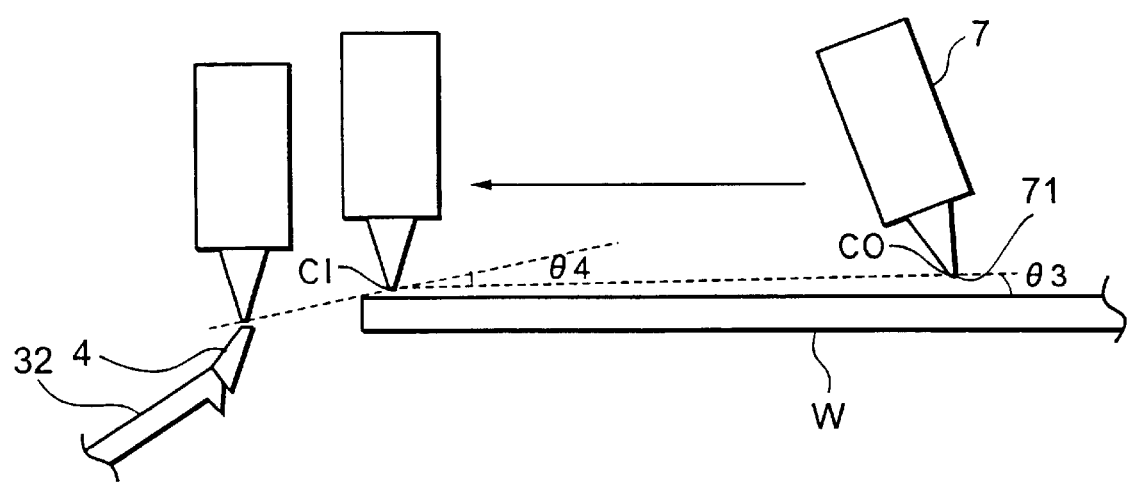
FIG. 7 is an explanatory view showing operations by another embodiment of a solution processing apparatus according to the present invention.

FIG. 7 shows another embodiment according to the present invention, in which a scan is performed such that the supply nozzle 7 slides an angle θ3 downwardly with respect to the horizontal plane from a point C0 before a point C1 in place of the horizontal scan of the supply nozzle 7 until it is returned to an upright position as shown in FIG. 4C in the aforesaid embodiment. An example in which the supply nozzle 7 slides an angle θ4 further downwardly from C1 is shown in FIG. 7. However, it is also suitable that the height of the tip of the knife ring 4 is positioned higher and the supply nozzle 7 is lowered while keeping the angle θ3 from C0 to pass by the knife ring 4, thereby separating the developing solution from the discharge ports 71.

It should be noted that alumina is taken as the material of the knife ring in this embodiment, but it is possible to use, for example, stainless steel as a material, as is alumina, having adhesion to the developing solution stronger than that of PCTFE (Teflon resin or another resin material with a high contact angle).

It should be noted that the solution processing apparatus according to this embodiment is not limited to developing processing, but may be applied to resist coating processing and rinse processing.

Figure 8:
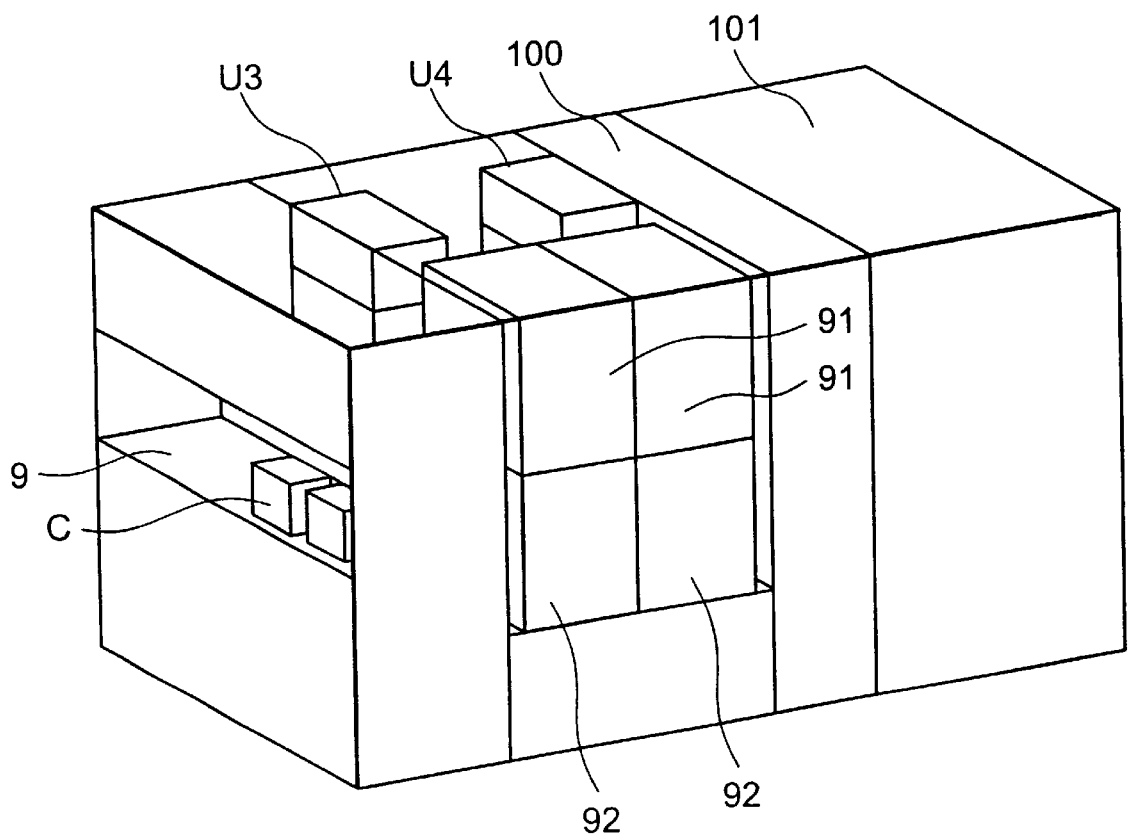
FIG. 8 is a perspective view showing an example of a coating and developing apparatus in which the solution processing apparatus is installed.
Figure 9:
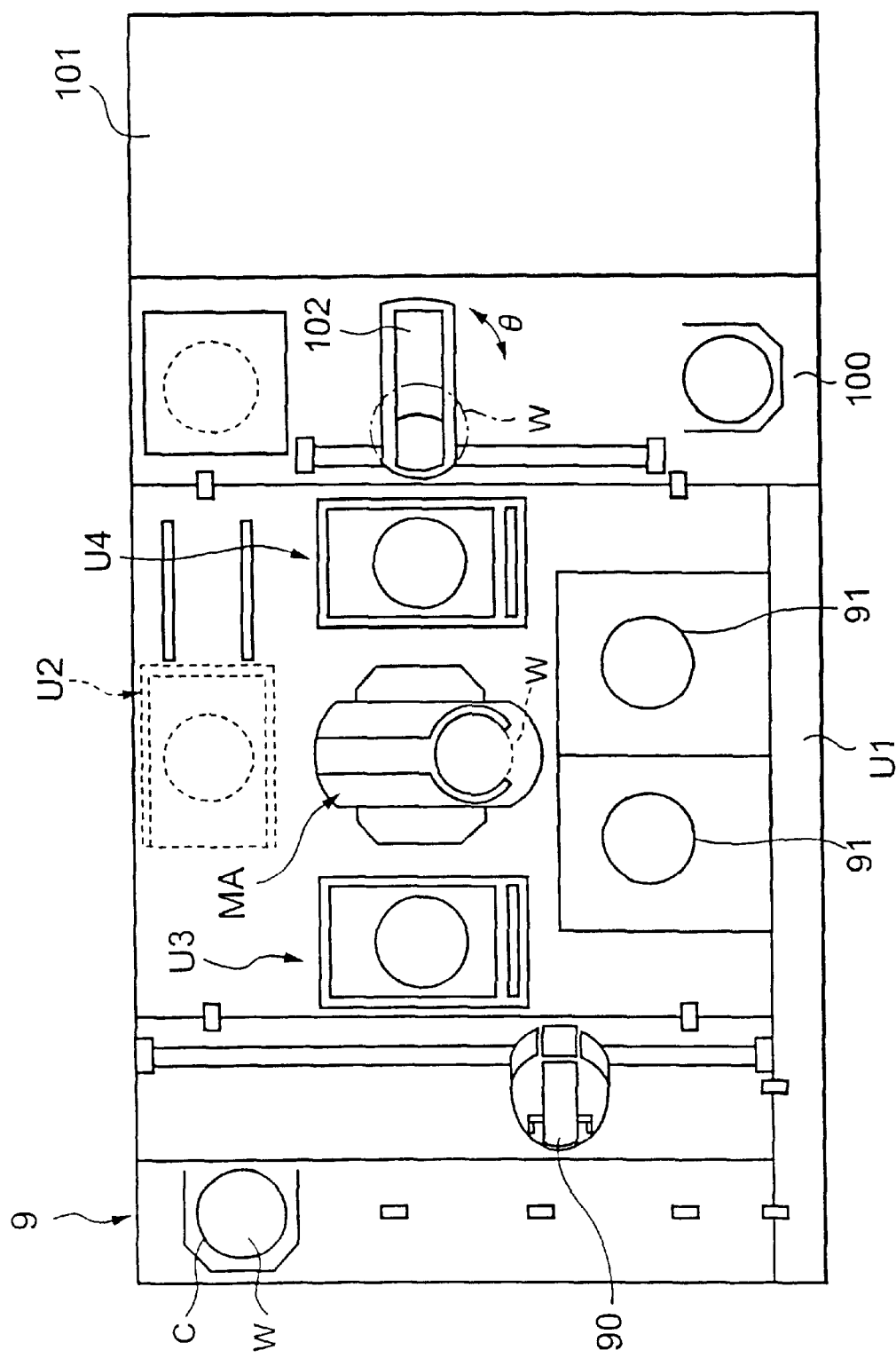
FIG. 9 is a plan view showing the example of the coating and developing apparatus in which the solution processing apparatus is installed.
Figure 10A:
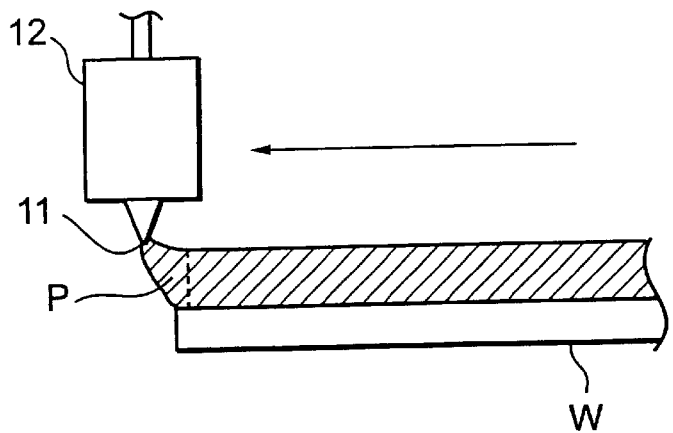
FIGS. 10A to 10C are explanatory views showing appearances of a solution film formed on a substrate by a conventional solution processing apparatus.
Figure 10B:
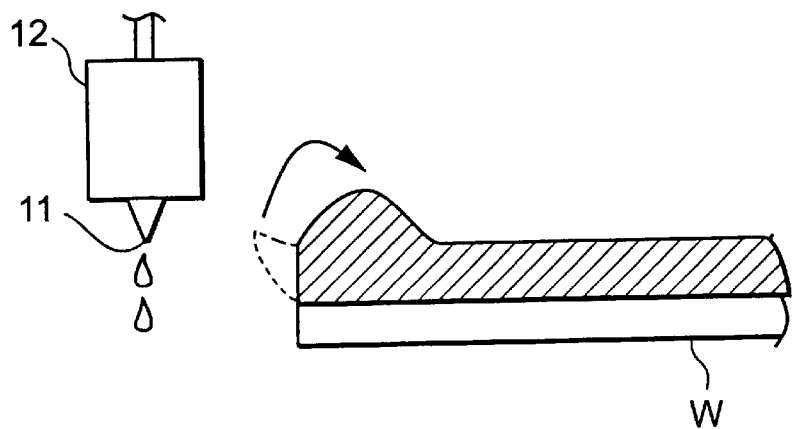
Figure 10C:
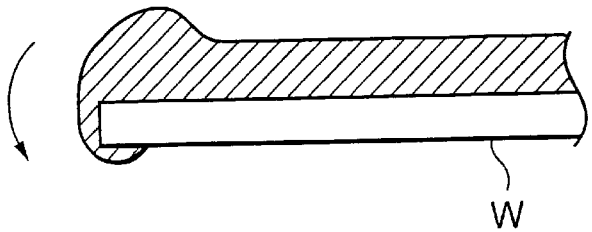

Next, an outline of an example of a coating and developing apparatus in which the aforesaid developing apparatus is installed in a unit will be explained with reference to FIGS. 8 and 9. A carrying in/out stage 9 is provided for carrying in/out a wafer cassette. A cassette C in which, for example, 25 wafers W are housed is mounted the stage 9 by, for example, an automatic transfer robot. A delivery arm 90 for the wafer W is provided to be movable in an X-, Z-, and Y-direction and rotatable in a θ-rotation (rotation around a vertical axis) in an area facing the carrying in/out stage 9. Moreover, on the back side of the delivery arm 90, a coating and developing system unit U1 (a coating unit 92, a developing unit 91) is arranged, for example, on the right side, for example, seen from the carrying in/out stage 9 to the back side, and heating and cooling system units U2, U3, and U4 each of which is composed of multi-tiered units are arranged on the left side, the front side, and the back side respectively. Further, for example, a wafer transfer arm MA which is ascendable and descendable, movable laterally and longitudinally, and rotatable around a vertical axis, for delivering the wafer W between the coating unit 92, the developing system unit 91, and the heating and cooling system units is provided. However, the unit U2 and the wafer transfer arm MA are not shown in FIG. 8 for convenience.

In the coating and developing system unit, for example, two developing units 91 provided with the aforesaid developing apparatuses are provided at the upper tier, and two coating units 92 are provided at the lower tier. The heating and cooling system unit has a structure in which a heating unit, a cooling unit, a hydrophobic processing unit, and the like are arranged to be housed at seven shelves in each of the units U2, U3, and U4.

Supposing that the aforesaid section including the coating and developing system unit and the heating and cooling system units is called a process station block, an aligner 101 is connected to the back side of the process station block with an interface block 100 therebetween. The interface block 100 performs delivery of the wafer W to/from the aligner 101 by, for example, a wafer transfer arm 102 which is configured to be ascendable and descendable, movable laterally and longitudinally, and rotatable around a vertical axis.

Explaining the flow of the wafer in this apparatus, first a wafer cassette C in which the wafers W are housed is carried into the carrying in/out stage 9 from the outside, and the wafer W is taken out of the cassette C by the wafer transfer arm 90 and delivered to the wafer transfer arm MA via a delivery table that is one of shelves in the aforesaid heating and cooling unit U3. Then, the wafer W is subjected to hydrophobic processing in a processing section at one shelf in the unit U3 and thereafter coated with a resist solution in the coating unit 92, whereby a resist film is formed. The wafer W coated with the resist film is heated in the heating unit and then transferred to a cooling unit of the unit U4 capable of delivering of the wafer W to/from the wafer transfer arm 102 of the interface block 100. After the processing, the wafer W is transferred to the aligner 101 via the interface block 100 and the wafer transfer arm 102, and exposure is performed through a mask corresponding to a pattern in the aligner 101. The wafer transfer arm 102 receives the wafer after the exposure processing and delivers it to the wafer transfer arm MA of the process station block via the delivery unit of the unit U4.

Thereafter, the wafer W is heated to a predetermined temperature in the heating unit and then cooled to a predetermined temperature in the cooling unit, and sequentially sent to the developing unit 91 to be subjected to developing processing, whereby a resist mask is formed. Thereafter, the wafer W is returned to the cassette C on the carrying in/out stage 9.

As has been described, according to the present invention, occurrence of a pull back phenomenon on the rim portion of the wafer can be suppressed, which reduces danger that an excessive processing solution is supplied onto the front face of the substrate, so that highly uniform solution processing can be performed. Further, it is also possible to prevent the processing solution supplied to the rim portion of the wafer from coming to the rear side.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solution processing apparatus, comprising:
    a substrate holding portion configured to horizontally hold a substrate having a front surface and a periphery;
    a supply nozzle configured to move across the substrate held by the substrate holding portion and supply a processing solution to the front face of the substrate; and
    a solution separation member having a summit portion and surrounding the periphery of the substrate with a clearance between the summit portion of the solution separation member and the periphery of the substrate, and configured to separate the processing solution existing between the periphery of the substrate and the supply nozzle by surface tension from the substrate and allow the processing solution to adhere to the solution separation member while the summit portion of the solution separation member is at a position lower than the front face of the substrate and the supply nozzle leaves the periphery of the substrate outwardly, the solution separation member being made of a material with adhesion to the processing solution stronger than that of the substrate.

2. The apparatus according to claim 1, further comprising:
    a raising and lowering mechanism configured to relatively raise and lower the supply nozzle, the substrate, and the solution separation member; and
    a control section which controls the supply nozzle to move the supply nozzle while decreasing in relative height with respect to the front face of the substrate and the summit portion of the solution separation member while the supply nozzle leaves the periphery of the substrate.

3. The apparatus according to claim 1, further comprising:
    a raising and lowering mechanism configured to relatively raise and lower the supply nozzle and one of the substrate and the solution separation member; and
    a control section which controls the supply nozzle to move the supply nozzle while decreasing in relative height with respect to the front face of the substrate and the summit portion of the solution separation member while to supply nozzle leaves the periphery of the substrate.

4. The apparatus according to clam 1, wherein the supply nozzle includes a plurality of discharge ports which are arrayed over nearly not less than a width of an effective area of the substrate, and moves across the substrate to supply the processing solution onto the front face of the substrate.

5. The apparatus according to claim 1, wherein the solution separation member is provided at a cup surrounding the substrate held by the substrate holding portion and being ascendable and descendable with respect to the substrate.

6. The apparatus according to claim 5, wherein the solution separation member comprises a knife member provided at a top end of the cup and inclined radially inwardly and upwardly, the knife member having a tapered tip.

7. The apparatus according to claim 6, wherein the knife member is formed of alumina.

8. A solution processing method, comprising the steps of:
    holding a substrate by a substrate holding portion, the substrate having a front face and a periphery;
    supplying a processing solution to the front face of the substrate while moving a supply nozzle across the substrate held by the substrate holding portion;
    allowing the processing solution to exist between a summit portion of a solution separation member, the periphery of the substrate, and the supply nozzle by surface tension while the summit portion is at a position lower than the front face of the substrate and the supply nozzle leaves the periphery of the substrate outwardly, the solution separation member surrounding the substrate with a clearance between the periphery of the substrate and the summit portion of the solution separation member; and allowing the processing solution to leave the periphery of the substrate and adhere to the solution separation member while the supply nozzle moves further outwardly.

9. The method according to claim 8, further comprising the steps of:

relatively raising and lowering the supply nozzle, the substrate, and the solution separation member; and controlling the supply nozzle to move the supply nozzle while decreasing in relative height with respect to the front face of the substrate and the summit portion of the solution separation member while the supply nozzle leaves the periphery of the substrate.

10. The method according to claim 8, further comprising the steps of:

relatively raising and lowering the supply nozzle and one of the substrate and the solution separation member; and controlling said supply nozzle to move the supply nozzle while decreasing in relative height with respect to the front face of the substrate and the summit portion of the solution separation member while the supply nozzle leaves the periphery of the substrate.

11. A solution processing apparatus, comprising:

a substrate holding portion configured to horizontally hold a substrate having a front surface and a periphery;

a supply nozzle configured to move across the substrate held by the substrate holding portion and supply a processing solution to the front face of the substrate;

a solution separation ring provided to surround the periphery of the substrate with a clearance between the summit portion of the solution separation ring and the periphery of the substrate, and configured to separate the processing solution existing between the periphery of the substrate and the supply nozzle by surface tension from the substrate and allow the processing solution to adhere to the solution separation ring while the supply nozzle leaves the periphery of the substrate outwardly, the solution separation ring being made of a material with adhesion to the processing solution stronger than that of the substrate;

a raising and lowering mechanism configured to relatively raise and lower the supply nozzle, the substrate, and the solution separation ring; and a control section configured to control the supply nozzle such that the supply nozzle moves while decreasing in relative height with respect to the front face of the substrate and the summit portion of the solution separation ring while the supply nozzle leaves the periphery of the substrate.

12. A solution processing apparatus, comprising:

a substrate holding portion configured to horizontally hold a substrate having a front surface and a periphery;

a supply nozzle configured to move across the substrate held by the substrate holding portion and supply a processing solution to the front face of the substrate;

a solution separation ring provided to surround the periphery of the substrate with a clearance between the summit portion of the solution separation ring and the periphery of the substrate, and configured to separate the processing solution existing between the periphery of the substrate and the supply nozzle by surface tension from the substrate and allow the processing solution to adhere to the solution separation ring while the supply nozzle leaves the periphery of the substrate outwardly, the solution separation ring being made of a material with adhesion to the processing solution stronger than that of the substrate;

a raising and lowering mechanism configured to relatively raise and lower the supply nozzle and one of the substrate and the solution separation ring; and a control section configured to control the supply nozzle such that the supply nozzle moves while decreasing in relative height with respect to the front face of the substrate and the summit portion of the solution separation ring while the supply nozzle leaves the periphery of the substrate.

13. A solution processing method, comprising the steps of:

holding a substrate by a substrate holding portion, the substrate having a front face and a periphery;

supplying a processing solution to the front face of the substrate while moving a supply nozzle across the substrate hold by the substrate holding portion;

allowing the processing solution to exist among a solution separation ring, the periphery of the substrate, and the supply nozzle by surface tension while the supply nozzle leaves the periphery of the substrate outwardly, the solution separation ring surrounding the substrate with a clearance between the periphery of the substrate and the summit portion of the solution separation ring; and thereafter allowing the processing solution to leave the periphery of the substrate and adhere to the solution separation ring while the supply nozzle moves further outwardly;

relatively raising and lowering the supply nozzle, the substrate and the solution separation ring; and controlling the supply nozzle such that the supply nozzle moves while decreasing in relative height with respect to the front face of the substrate and the summit portion of the solution separation ring while the supply nozzle leaves the periphery of the substrate.

14. A solution processing method, comprising the steps of:

holding a substrate by a substrate holding portion, the substrate having a front face and a periphery;

supplying a processing solution to the front face of the substrate while moving a supply nozzle across the substrate held by the substrate holding portion;

allowing the processing solution to exist among a solution separation ring, the periphery of the substrate, and the supply nozzle by surface tension while the supply nozzle leaves the periphery of the substrate outwardly, the solution separation ring surrounding the substrate with a clearance between the periphery of the substrate and the summit portion of the solution separation ring; and thereafter allowing the processing solution to leave the periphery of the substrate and adhere to the solution separation ring while the supply nozzle moves further outwardly;

relatively raising and lowering the supply nozzle and one of the substrate and the solution separation ring; and controlling the supply nozzle such that the supply nozzle moves while decreasing in relative height with respect to the front face of the substrate and the summit portion of the solution separation ring while the supply nozzle leaves the periphery of the substrate.

15. A solution processing apparatus, comprising:

a wafer holding portion configured to horizontally hold a wafer having a front surface and a periphery;

a supply nozzle configured to move in a radial direction of the wafer over the wafer held by the wafer holding portion and supply a processing solution to the front face of the wafer; and a solution separation ring having a summit portion and surrounding the periphery of the wafer with a clearance between the summit portion of the solution separation ring and the periphery of the wafer, and configured to separate the processing solution existing between the periphery of the wafer and the supply nozzle by surface tension from the wafer and allow the processing solution to adhere to the solution separation ring while the summit portion of the solution separation ring is at a position lower than the front face of the wafer and the supply nozzle leaves the periphery of the wafer outwardly, the solution separation ring being made of a material with adhesion to the processing solution stronger than that of the wafer.

16. The apparatus according to claim 15, further comprising:

a raising and lowering mechanism configured to relatively raise and lower the supply nozzle, the wafer, and the solution separation ring; and a control section which controls the supply nozzle to move the supply nozzle while decreasing in relative height with respect to the front face of the wafer and the summit portion of the solution separation ring while the supply nozzle leaves the periphery of the wafer.

17. The apparatus according to claim 15, further comprising:

a raising and lowering mechanism configured to relatively raise and lower the supply nozzle and one of the wafers and the solution separation ring; and a control section which controls the supply nozzle to move the supply nozzle while decreasing in relative height with respect to the front face of the wafer and the summit portion of the solution separation ring while the supply nozzle leaves the periphery of the wafer.

18. A solution processing method, comprising the steps of:

holding a wafer by a wafer holding portion, the wafer having a front face and a periphery;

supplying a processing solution to the front face of the wafer while moving a supply nozzle in a radial direction of the wafer over the wafer held by the wafer holding portion;

allowing the processing solution to exist between a summit portion of a solution separation ring, the periphery of the wafer, and the supply nozzle by surface tension while the summit portion of the solution separation ring is at a position lower than the front face of the wafer and the supply nozzle leaves the periphery of the wafer outwardly, the solution separation ring surrounding the wafer with a clearance between the periphery of the wafer and the summit portion of the solution separation ring; and allowing the processing solution to leave the periphery of the wafer and adhere to the solution separation ring while the supply nozzle moves further outwardly.

19. The method according to claim 18, further comprising the steps of:

relatively raising and lowering the supply nozzle, the wafer, and the solution separation ring; and controlling the supply nozzle to move the supply nozzle while decreasing in relative height with respect to the front face of the wafer and the summit portion of the solution separation ring while the supply nozzle leaves the periphery of the wafer.

20. The method according to claim 18, further comprising the steps of:

relatively raising and lowering the supply nozzle and one of the wafers and the solution separation ring; and controlling the supply nozzle to move the supply nozzle while decreasing in relative height with respect to the front face of the wafer and the summit portion of the solution separation ring while the supply nozzle leaves the periphery of the wafer.

* * * * *